United States Patent
Strolle

[11] Patent Number: 6,154,503
[45] Date of Patent: Nov. 28, 2000

[54] AUTOMATIC GAIN CONTROL SYSTEM THAT RESPONDS TO BASEBAND SIGNAL DISTORTION

[75] Inventor: Christopher Hugh Strolle, Glenside, Pa.

[73] Assignees: Sharp KK Corporation, Osaka, Japan; Sarnoff Corporation, Princeton, N.J.

[21] Appl. No.: 08/869,590

[22] Filed: Jun. 5, 1997

Related U.S. Application Data

[60] Provisional application No. 60/019,302, Jun. 7, 1996.

[51] Int. Cl.⁷ .................................................. H04L 23/02
[52] U.S. Cl. ......................... 375/264; 375/345; 375/346; 455/234.1
[58] Field of Search .................... 375/345, 264, 375/261, 346; 455/232.1, 234.1

[56] References Cited

U.S. PATENT DOCUMENTS

| | | | |
|---|---|---|---|
| 4,864,244 | 9/1989 | Sasaki | 329/304 |
| 5,235,424 | 8/1993 | Wagner et al. | 358/174 |
| 5,347,569 | 9/1994 | Yamamoto | 375/39 |
| 5,381,450 | 1/1995 | Lane | 375/94 |
| 5,444,743 | 8/1995 | Scarpa | 375/368 |
| 5,448,595 | 9/1995 | Kaku et al. | 375/345 |
| 5,636,252 | 6/1997 | Patel et al. | 375/345 |
| 5,671,253 | 9/1997 | Stewart | 375/361 |
| 5,805,241 | 9/1998 | Limberg | 348/725 |

*Primary Examiner*—Stephen Chin
*Assistant Examiner*—Dac V. Ha
*Attorney, Agent, or Firm*—William J. Burke

[57] ABSTRACT

An automatic gain control (AGC) system that monitors the distortion of the outer constellation points of a complex modulation format such as quadrature amplitude modulation (QAM) and adjusts both the RF and IF AGC gain to minimize such distortion. In particular, the receiver contains at least two stages of AGC gain. Typically, the RF AGC amplifier is contained in the tuner that is followed by an IF AGC amplifier. The IF amplifier is coupled to a mixer and an associated low pass filter which, in combination and when driven by a particular frequency, produces a baseband (or near baseband) signal, The baseband signal is digitized and processed by a gain control circuit. The gain control circuit produces IF and RF AGC signals that control the gain of the respective AGC stages.

20 Claims, 1 Drawing Sheet

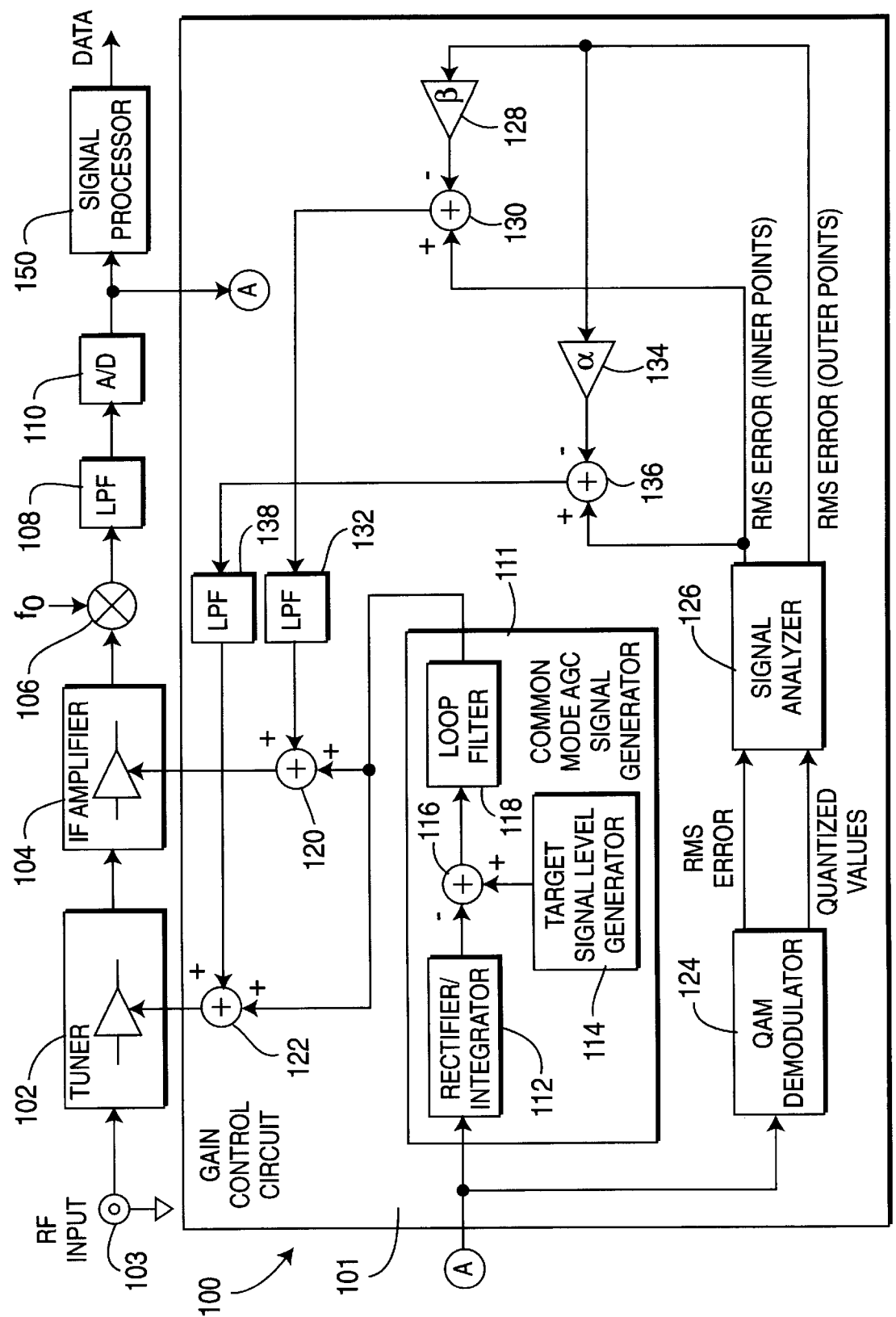

AUTOMATIC GAIN CONTROL SYSTEM THAT RESPONDS TO BASEBAND SIGNAL DISTORTION

This patent application claims benefit of U.S. provisional patent application Ser. No. 60/019,302 filed Jun. 7, 1996.

The invention relates to digital information transmission systems and, more particularly, to a system for providing automatic gain control to optimize signal-to-noise ratio and minimize signal distortion.

BACKGROUND OF THE DISCLOSURE

Various communications systems utilize quadrature amplitude modulation (QAM) for transmission of relatively high data rate information within a limited transmission bandwidth. Typically, QAM communications systems use a fixed symbol constellation for all transmissions, e.g., 16-ary QAM or sixteen positions or symbol points within a constellation. It is desirable that receivers in such communications systems have some type of automatic gain control (AGC) circuitry so that the ratio of received QAM signal to background noise is optimized and the received QAM signal suffers minimal distortion as it is processed by the receiver. This condition is achieved using AGC circuitry that maintains a constant signal level out of the tuner portion of the QAM receiver as the input RF signal fades or is attenuated. In a typical QAM receiver, the AGC circuitry contains two stages, an IF AGC within an IF stage of the receiver and an RF AGC within an RF stage of the receiver, where the IF AGC circuitry follows the RF AGC circuitry. As such, the IF AGC is maintained at a constant gain until the RF AGC applies a maximum gain to the input RF signal. Once the maximum RF AGC gain is attained, the IF AGC circuitry becomes operational to further amplify the IF signal.

However, when a signal is amplified at an amplifier's gain limit, the amplifier produces intermodulation distortion. In QAM, this distortion typically effects the outermost constellation points. Given an input signal with a low signal-to-noise ratio, a QAM receiver has difficulty demodulating the outermost constellation points when the IF and RF AGC circuit gain is near or at its maximum limit.

Thus, there is a need for a system that provides optimal gain control in both the RF and IF stages of a QAM receiver to minimize intermodulation distortion.

SUMMARY OF THE INVENTION

The disadvantages heretofore associated with the prior art are overcome by the invention of an automatic gain control (AGC) system that monitors the distortion of the outer constellation points of a complex modulation format such as quadrature amplitude modulation (QAM) and adjusts both the RF and IF AGC gain to minimize such distortion. In particular, a receiver contains at least two stages of AGC gain. Typically, the RF AGC amplifier is contained in a tuner that is followed by an IF AGC amplifier. The IF amplifier is coupled to a mixer and an associated low pass filter which, in combination and when driven by a particular frequency, produces a baseband (or near baseband) signal, The baseband signal is digitized and processed by a gain control circuit. The gain control circuit produces IF and RF AGC signals that control the gain of the respective AGC stages.

The gain control circuit contains a common mode signal generator that produces a common mode signal that represents the difference between the magnitude of the baseband signal and a target signal level. The common mode signal is altered by two biasing signals that reflect the RMS error contained in the various constellation levels of the baseband signal. The gain control circuit further contains a digital modulation demodulator, e.g., a QAM demodulator, coupled to a signal analyzer. The demodulator and the analyzer produce an RMS error value representing the error (noise) in the outer level of the constellation and an RMS error value representing the error (noise) the inner level of the constellation. The RMS error values for each level are compared to determine when the outer constellation points are becoming distorted. In response to a distortion determination, a particular pair of biasing signal values are produced and combined with the SAR 12083 common mode signal. The resulting signals form the IF and RF AGC signals. In operation, when distortion is detected in the outer constellation points, the AGC signals appropriately adjust the gain of both the RF and IF amplifiers to reduce the RMS error associated with the outer points.

BRIEF DESCRIPTION OF THE DRAWING

The teachings of the present invention can be readily understood by considering the following detailed description in conjunction with the accompanying drawing, in which:

FIG. 1 depicts a block diagram of the AGC system of the present invention.

DETAILED DESCRIPTION

FIG. 1 depicts a block diagram which indicates the interconnection of various analog and digital circuitry components required to implement the automatic gain control (AGC) system of the present invention. The AGC system 100 contains a tuner 102, an IF amplifier 104, a mixer 106, a low pass filter 108, an analog-to-digital (A/D) converter 110 and a gain control circuit 101. The tuner 102 receives QAM modulated (e.g., M-ary QAM, where M is 16, 32, 128, 256, and the like) radio frequency (RF) signal at input port 103. The tuner is a conventional unit that amplifies the RF signal, downconverts the RF signal to an intermediate frequency (IF) and filters the IF signal. The tuner has at least one stage of amplification having a voltage controllable gain, i.e., the tuner contains an RF AGC amplifier.

The tuner 102 is connected to an IF amplifier 104 containing at least one amplification stage that is also gain controlled. The amplified IF signal produced by the IF amplifier has a substantially constant signal strength as a result of the two stages of AGC.

The amplified IF signal is applied to one port of a mixer 106. Another input port of the mixer is driven with a nominal frequency ($f_0$) that, when mixed with the amplified IF signal, produces a baseband (or near baseband) signal. The specific frequency used is unimportant to the operation of the invention and, in general, is defined by the center frequency of the IF signal. The baseband signal is filtered by the low pass filter 108 and then digitized by the A/D converter 110. A signal processor 150 conventionally demodulates the digitized baseband signal to recover the modulation. The signal processor is shown only to complete the depiction of a practical receiver. The signal processor does not form any part of the invention. Additionally, the digitized baseband signal is processed by the gain control circuit 101 to produce optimal gain control signals that minimize intermodulation distortion produced by the RF and IF stages. This is accomplished by monitoring the received QAM constellation and ensuring that the AGC amplifiers do not attain gain levels that produce intermodulation distortion.

Specifically, the gain control circuit 101 contains a common mode signal generator 111, a quadrature demodulator 124, a signal analyzer 126, a pair of amplifiers 134 and 128, a pair of subtractors 130 and 136, a pair of low pass filters 132 and 138, and a pair of adders 120 and 122. The digital baseband signals are processed to create a common mode AGC signal as well as RMS error signals which are combined and fed back to the tuner 102 and IF amplifier 104 to achieve the desired AGC results.

The common mode signal generator 111 contains a rectifier/integrator 112, a subtractor 116, a target signal level generator 114, and a loop filter 118. The common mode signal is produced by first rectifying and averaging the digital baseband signal using rectifier/integrator 112. The integrator averages the rectified digital signals to produce an average signal. The subtractor 116 subtracts the average signal from a target signal level that is generated by target value generator 114. Ideally, when the AGC system is optimally operating, the magnitude of the average signal is maintained at the target signal level for all magnitudes of input signal. As such, the target signal level is a constant value that corresponds to a nominal signal strength for the average signal. The particular value of the target signal level depends upon the parameters of the particular application for the system, e.g., expected received signal levels, the gain and dynamic range in each stage, mixer conversion gain, filter passband loss, and the like. Additionally, a number of target signal levels can be preprogrammed into registers to accommodate a variety of system applications.

The error signal from the subtractor 116 is then low pass filtered by the loop filter 118. The signal exiting the filter 118 is referred to at the common mode AGC signal. The common mode signal varies in an inverse relationship with the average signal level. The common mode signal is, in essence, a conventional AGC signal that is derived from the average signal strength of the baseband signal.

The common mode AGC signal is applied to two adders 122 and 120 respectively. Biasing signals, to be discussed below, are also applied to adders 122 and 120 to create the AGC control signals which are applied to the RF AGC amplifier within the tuner 102 and the IF amplifier 104 to control the respective gains of these amplifiers.

Biasing signals for the common mode AGC signal are attained by monitoring the RMS error of the inner and outer constellation points of the QAM signal. Taken together, the inner points represent an inner signaling level (inner level) and the outer points represent an outer signaling level (outer level). If the QAM signal has intermediate levels, they are ignored. To monitor the constellation, the QAM signal is demodulated and then processed to find the RMS error associated with each of the constellation levels. As such, the digital baseband signal from the A/D converter 110 is applied to the QAM demodulator 124. The output of the QAM demodulator 124 produces two signals, the RMS error of the demodulated signal and the quantized value of the symbol location of demodulated signal. Therefore, for each digital signal processed by the QAM demodulator, there is a corresponding value assigned to identify the signal as either an inner or outer constellation point and an RMS error value associated with the point. The RMS error is proportional to the distance that the quantized value is from an ideal constellation point location.

These two output signals are applied to the signal analyzer 126 to identify the inner and outer point RMS error values. The analyzer 126 compares each quantized QAM signal to a threshold to determine if a particular quantized value is an outer level point or is an inner level point. If there are intermediate levels, the analyzer may use multiple thresholds, one to identify inner level points and one to identify outer level points, to identify the points of interest and eliminate all others. For each inner point, the analyzer integrates its associated RMS error value. Similarly, for each outer point, the analyzer integrates its associated RMS error value. Thus, the output from the analyzer is an average RMS error associated with the inner points and an average RMS error associated with the outer points.

The average RMS error associated the outer points is then passed through amplifiers 128 and 134. Amplifier 134 multiples the error by a first factor ($\alpha$) and amplifier 128 multiplies the error by a second factor ($\beta$). Generally, $\alpha \leq 1$ and $\beta \geq 1$; however, experimentation indicates that acceptable gain control is achieved with $\alpha = 0.5$ and $\beta = 1.5$.

Amplifier 128 is connected to subtractor 130 and amplifier 134 is connected to subtractor 136. As such, the amplified RMS error value for the outer constellation points is then subtracted from the inner point RMS error value using subtractors 130 and 136. The resulting difference values are filtered using low pass filters 132 and 138. The output signals from each of the low pass filters form biasing signals that are applied to an input terminal of the adders 122 and 120. As such, the biasing signals are combined with the common mode signal to produce the RF and IF AGC control signals. More particularly, the biasing signal from the filter 132 is combined with the common mode signal using adder 120 to form the IF AGC signal. Similarly, the biasing signal from the filter 138 is combined with the common mode signal using adder 122 to form the RF AGC signal. Thus the IF and RF AGC signals are independent from one another.

In operation, the system of the present invention determines when the RMS error of the outer constellation points exceeds the RMS error of the inner points. At that time, the IF signal level is deemed too high and a decrease in the IF AGC gain is warranted to avoid distorting the outer points in the constellation. In addition, the RF AGC signal also automatically decreases. In the event that the input RF signal level decreases, both RF and IF AGC signals increase due to an increase in the common mode signal level. However, the RF AGC signal increases above the common mode signal level because the biasing signal is acting to reduce inner constellation point noise which decreases as the RF AGC level increases.

Although the foregoing embodiment recites AGC amplifiers as the components that control the gain of the RF and IF stages, those skilled in the art will understand that voltage controlled attenuation would function as well. Also, the inventive system is designed to operate using any size QAM modulation constellation. The only component that is constellation size dependent is the QAM demodulator. However, depending on the system application, various demodulators can be used, or a demodulator capable of demodulating various constellation sizes could be used.

Furthermore, the present invention, although discussed in the context of receiving QAM signals, can be adapted to perform AGC in receivers of other digital modulation formats including QPSK, BPSK, offset QPSK, VSB and the like. Additionally, the foregoing embodiment depicts two stages of AGC, those skilled in the art could readily adapt the invention to have additional stages of AGC.

Although one embodiment which incorporates the teachings of the present invention has been shown and described in detail herein, those skilled in the art can readily devise many other varied embodiments that still incorporate these teachings.

What is claimed is:

1. Apparatus for automatically adjusting gain of an input signal comprising:

a common mode signal generator for generating a common mode signal from the input signal, where the common mode signal represents the difference between the magnitude of the input signal and a target signal level;

a demodulator for demodulating the input signal to form symbol values and determining an error value for each symbol value;

a signal analyzer, coupled to the demodulator, for identifying at least two sets of error values having common characteristics and calculating an average error value for each set of error values; and a control signal generator, coupled to said signal analyzer and said common mode generator, for manipulating the average error values and common mode signal to produce a gain control signal.

2. The apparatus of claim 1 wherein the common mode signal generator further comprises:

a rectifier/integrator for determining an average value of the input signal, a target signal level generator for generating a nominal average value of the input signal, a subtractor, coupled to the rectifier/integrator and target signal level generator, for calculating a difference value between the nominal average value and the average value, and a loop filter, coupled to the subtractor, for filtering the difference value to form the common mode signal.

3. The apparatus of claim 2 wherein the demodulator is a quadrature amplitude modulation (QAM) demodulator.

4. The apparatus of claim 3 wherein one set of average error values is derived from inner constellation points of a QAM demodulated input signal and another set of average error values is derived from outer constellation points of a QAM demodulated input signal, where the signal analyzer integrates the inner constellation points to establish an inner point average error value and integrates the outer constellation points to establish an outer point average error value.

5. The apparatus of claim 4 wherein the control signal generator comprises:

first and second amplifiers having first ($\alpha$) and second ($\beta$) amplification factors for amplifying the outer point average error value, respectively, a first subtractor, coupled to said first amplifier and said signal analyzer, for subtracting the first amplified outer point average error value from the inner point average error value, a second subtractor, coupled to said second amplifier and said signal analyzer, for subtracting the second amplified outer point average error value from the inner point average error value, first and second low pass filters, connected to the first and second subtractors, for forming first and second biasing signals, respectively, and first and second adders, coupled to the first and second low pass filters, respectively, for adding the first and second biasing signals to the common mode signal to produce a first and a second control signal.

6. The apparatus of claim 5 wherein the first control signal forms a radio frequency tuner automatic gain control signal.

7. The apparatus of claim 5 wherein the second control signal forms an intermediate frequency amplifier automatic gain control signal.

8. The apparatus of claim 5 wherein $\alpha \leq 1$.

9. The apparatus of claim 5 wherein $\beta \geq 1$.

10. The apparatus of claim 8 wherein $\alpha = 0.5$.

11. The apparatus of claim 9 wherein $\beta = 1.5$.

12. Method of determining automatic gain control signals comprising the steps of:

creating a common mode signal from an input signal, where the common mode signal represents the difference between the magnitude of the input signal and a target signal level;

determining a plurality of error values, where each of the error values corresponds to a symbol value in an input signal;

determining, in response to the plurality of error values, at least two sets of average error values; and generating the automatic gain control signals in response to the sets of average error values.

13. The method of claim 12 wherein the average error value determining step further comprises the steps of:

deriving one set of average error values from quadrature amplitude modulation (QAM) demodulated inner constellation points, and deriving another set of the average error values from QAM demodulated outer constellation points.

14. The method of claim 13 wherein the generating step further comprises the steps of:

amplifying the outer points average error value with first ($\alpha$) and second ($\beta$) amplification factors, respectively, subtracting the amplified outer points average error value from the inner points average error value, respectively, to produce a first and second difference signal, filtering the first and second difference signals to form first and second biasing signals, respectively, and adding the first and second biasing signals to the common mode signal, respectively, to form first and second automatic gain control signals.

15. The method of claim 14 wherein the first automatic gain control signal is a radio frequency automatic gain control signal.

16. The method of claim 14 wherein the second automatic gain control signal is an intermediate frequency automatic gain control signal.

17. The method of claim 14 wherein $\alpha \leq 1$.

18. The method of claim 14 wherein $\beta \geq 1$.

19. The method of claim 17 wherein $\alpha = 0.5$.

20. The method of claim 18 wherein $\beta = 1.5$.

* * * * *